United States Patent
Roobol et al.

(10) Patent No.: US 10,983,361 B2
(45) Date of Patent: Apr. 20, 2021

(54) METHODS OF ALIGNING A DIFFRACTIVE OPTICAL SYSTEM AND DIFFRACTING BEAMS, DIFFRACTIVE OPTICAL ELEMENT AND APPARATUS

(71) Applicant: ASML Netherlands B.V., Veldhoven (NL)

(72) Inventors: Sander Bas Roobol, Veldhoven (NL); Simon Gijsbert Josephus Mathijssen, Rosmalen (NL); Stefan Michael Bruno Bäumer, Valkenswaard (NL)

(73) Assignee: ASML Netherlands B.V, Veldhoven (NL)

( * ) Notice: Subject to any disclaimer, the term of this patent is extended or adjusted under 35 U.S.C. 154(b) by 584 days.

(21) Appl. No.: 15/898,394

(22) Filed: Feb. 16, 2018

(65) Prior Publication Data
US 2018/0239160 A1    Aug. 23, 2018

(30) Foreign Application Priority Data
Feb. 23, 2017 (EP) .................................... 17157671

(51) Int. Cl.
G02B 27/62 (2006.01)
G02B 27/42 (2006.01)
G03F 7/20 (2006.01)

(52) U.S. Cl.
CPC ......... *G02B 27/4255* (2013.01); *G02B 27/62* (2013.01); *G03F 7/7085* (2013.01);
(Continued)

(58) Field of Classification Search
CPC ...... G02B 27/4255; G02B 27/42; G02B 5/18; G02B 27/62; G03F 7/70158;
(Continued)

(56) References Cited

U.S. PATENT DOCUMENTS

| 6,417,922 B1* | 7/2002 | Dirksen .............. G03F 7/70258 |
| | | 250/548 |
| 2006/0066855 A1 | 3/2006 | Boef et al. |

(Continued)

FOREIGN PATENT DOCUMENTS

| DE | 102009052739 A1 | 6/2010 |
| DE | 102012216286 A1 | 4/2013 |

(Continued)

OTHER PUBLICATIONS

International Search Report and Written Opinion of the International Searching Authority directed to related International Patent Application No. PCT/EP2018/051843, dated Mar. 14, 2018; 15 pages.

*Primary Examiner* — Balram T Parbadia
(74) *Attorney, Agent, or Firm* — Sterne, Kessler, Goldstein & Fox P.L.L.C.

(57) ABSTRACT

A method of aligning a diffractive optical system, to be operated with an operating beam, comprises: aligning (558) the diffractive optical system using an alignment beam having a different wavelength range from the operating beam and using a diffractive optical element optimized (552) to diffract the alignment beam and the operating beam in the same (or a predetermined) direction. In an example, the alignment beam comprises infra-red (IR) radiation and the operating beam comprises soft X-ray (SXR) radiation. The diffractive optical element is optimized by providing it with a first periodic structure with a first pitch (pIR) and a second periodic structure with a second pitch (pSXR). After alignment, the vacuum system is pumped down (562) and in operation the SXR operating beam is generated (564) by a high harmonic generation (HHG) optical source pumped by the IR alignment beam' optical source.

20 Claims, 7 Drawing Sheets

(52) U.S. Cl.
CPC ...... *G03F 7/70158* (2013.01); *G03F 7/70258* (2013.01); *G03F 7/70316* (2013.01); *G03F 7/70575* (2013.01); *G03F 7/70591* (2013.01)

(58) Field of Classification Search
CPC ............. G03F 7/70258; G03F 7/70316; G03F 7/70575; G03F 7/70591; G03F 7/7085; G03F 7/20; G01B 11/00; G11B 7/1353
See application file for complete search history.

(56) References Cited

U.S. PATENT DOCUMENTS

| | | | |
|---|---|---|---|
| 2007/0114678 A1* | 5/2007 | Van Haren | G03F 9/7088 257/797 |
| 2007/0132996 A1* | 6/2007 | Van Haren | G03F 9/7076 356/401 |
| 2008/0111995 A1* | 5/2008 | Lee | G03F 7/70625 356/499 |
| 2008/0186577 A1* | 8/2008 | Stallinga | G11B 7/1353 359/566 |
| 2009/0153825 A1* | 6/2009 | Edart | G03F 9/7065 355/67 |
| 2011/0102753 A1 | 5/2011 | Van De Kerkhof et al. | |
| 2011/0222156 A1 | 9/2011 | Jeong et al. | |
| 2012/0044470 A1 | 2/2012 | Smilde et al. | |

FOREIGN PATENT DOCUMENTS

| | | |
|---|---|---|
| DE | 102013204015 A1 | 9/2014 |
| EP | 1 001 301 A2 | 5/2000 |
| JP | H07-253528 A | 10/1995 |
| JP | 2005-165167 A | 6/2005 |
| WO | WO 2016-150957 A1 | 9/2016 |

* cited by examiner

METHODS OF ALIGNING A DIFFRACTIVE OPTICAL SYSTEM AND DIFFRACTING BEAMS, DIFFRACTIVE OPTICAL ELEMENT AND APPARATUS

CROSS-REFERENCE TO RELATED APPLICATIONS

This application incorporates by reference in its entirety EP Patent Application No. 17157671, filed Jan. 23, 2017.

FIELD

The present invention relates to methods of aligning a diffractive optical system, a method of diffracting, a diffractive optical element and associated metrology and lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR (near-infra-red) wave range, which requires the pitch of the grating to be much coarser than the actual product structures whose properties are actually of interest. Such product features may be defined using deep ultraviolet (DUV) or extreme ultraviolet (EUV) radiation having far shorter wavelengths. Unfortunately, such wavelengths are not normally available or usable for metrology.

The dimensions of modern product structures are so small that they cannot be imaged by conventional optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads are also known, but provide only indirect evidence of the true product structure.

By decreasing the wavelength of the radiation used during metrology (i.e. moving towards the "soft X-ray" wavelength spectrum), it is possible to resolve smaller structures, to increase sensitivity to structural variations of the structures and/or penetrate further into the product structures. One such method of generating suitably high frequency radiation is by using a high harmonic generation (HHG) radiation source. Such a HHG radiation source uses laser radiation (e.g., infra-red (IR) radiation) to excite a HHG generating medium, thereby generating high harmonics comprising high frequency radiation.

The optical elements along the optical path of SXR (soft X-ray) scatterometers may comprise several mirrors and gratings. Other optical elements include optical sources and sensors. Some of the optical elements will have to be aligned with positioning accuracies in the μm and mrad range.

It is necessary to align the optical elements of an SXR scatterometer during the assembly phase (and during subsequent maintenance) when there is no vacuum. In these conditions, SXR (absorbed by air at atmospheric pressure) is not available for performing alignment of the diffractive optical system. For mirrors, this is no problem as SXR mirrors also reflect IR, and they are readily aligned using the IR beam. For the gratings this does not work, because the diffraction angles depend on the wavelength. This means that only the 0th order (reflection) can be aligned to, but not the precise grating orientation, which is especially relevant for asymmetric conical diffraction conditions, which have certain favorable properties. In particular, they can be made with very high diffraction efficiency. Therefore alignment is difficult to implement and is complex. Because the optical elements cannot be aligned at atmospheric pressure taking into account the paths of the diffracted beam(s), the alignment cannot be fixed at the non-vacuum assembly or maintenance stages. Further alignment checks are needed under vacuum using SXR illumination. Other diffractive optical systems that have such problems include other metrology and inspection apparatus, lithographic apparatus and monochromators. The diffractive optical elements may be anywhere along the optical path.

SUMMARY

It would be desirable to improve alignment of diffractive optical systems and overcome at least some of the above-mentioned problems.

According to a first aspect of the present invention, there is provided a method of aligning a diffractive optical system to be operated with an operating beam, the method comprising: aligning the diffractive optical system using an alignment beam having a different wavelength range from the operating beam and using a diffractive optical element optimized to diffract the alignment beam and the operating beam in predetermined directions.

According to a second aspect of the present invention, there is provided a method of diffracting first and second beams having different wavelength ranges in a same direction, the method comprising: using a diffractive optical element having a first periodic structure with a first pitch and a second periodic structure with a second pitch, wherein the pitches are selected to diffract the first and second beams in the same direction.

According to a third aspect of the present invention, there is provided a method of aligning a diffractive optical system to be operated with an operating beam, the method comprising diffracting first and second beams having different wavelength ranges in a same direction in accordance with the second aspect, wherein the first beam is an alignment beam and the second beam is the operating beam.

According to a fourth aspect of the present invention, there is provided a diffractive optical element for diffracting first and second beams having different wavelength ranges in a same direction, the diffractive optical element comprising: a first periodic structure with a first pitch and a second periodic structure with a second pitch, wherein the pitches are selected to diffract the first and second beams in the same direction.

According to a fifth aspect of the present invention, there is provided a diffractive optical element for diffracting first and second beams having different wavelength ranges in predetermined directions, the diffractive optical element comprising:

a first periodic structure with a first pitch and a second periodic structure with a second pitch, wherein the pitches are selected to diffract the first and second beams in the predetermined directions wherein:

the first periodic structure is formed at a region corresponding to the first beam's spot when projected on the diffractive optical element; and the second periodic structure is formed at a region corresponding to the second beam's spot when projected on the diffractive optical element.

According to a sixth aspect of the present invention, there is provided a metrology apparatus comprising the diffractive optical element of the fourth or the fifth aspect.

According to a seventh aspect of the present invention, there is provided a lithographic apparatus comprising the diffractive optical element of the fourth or the fifth aspect.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present example environments in which embodiments of the present invention may be implemented. FIGS. 1 to 4 illustrate such environments.

Figure 1:
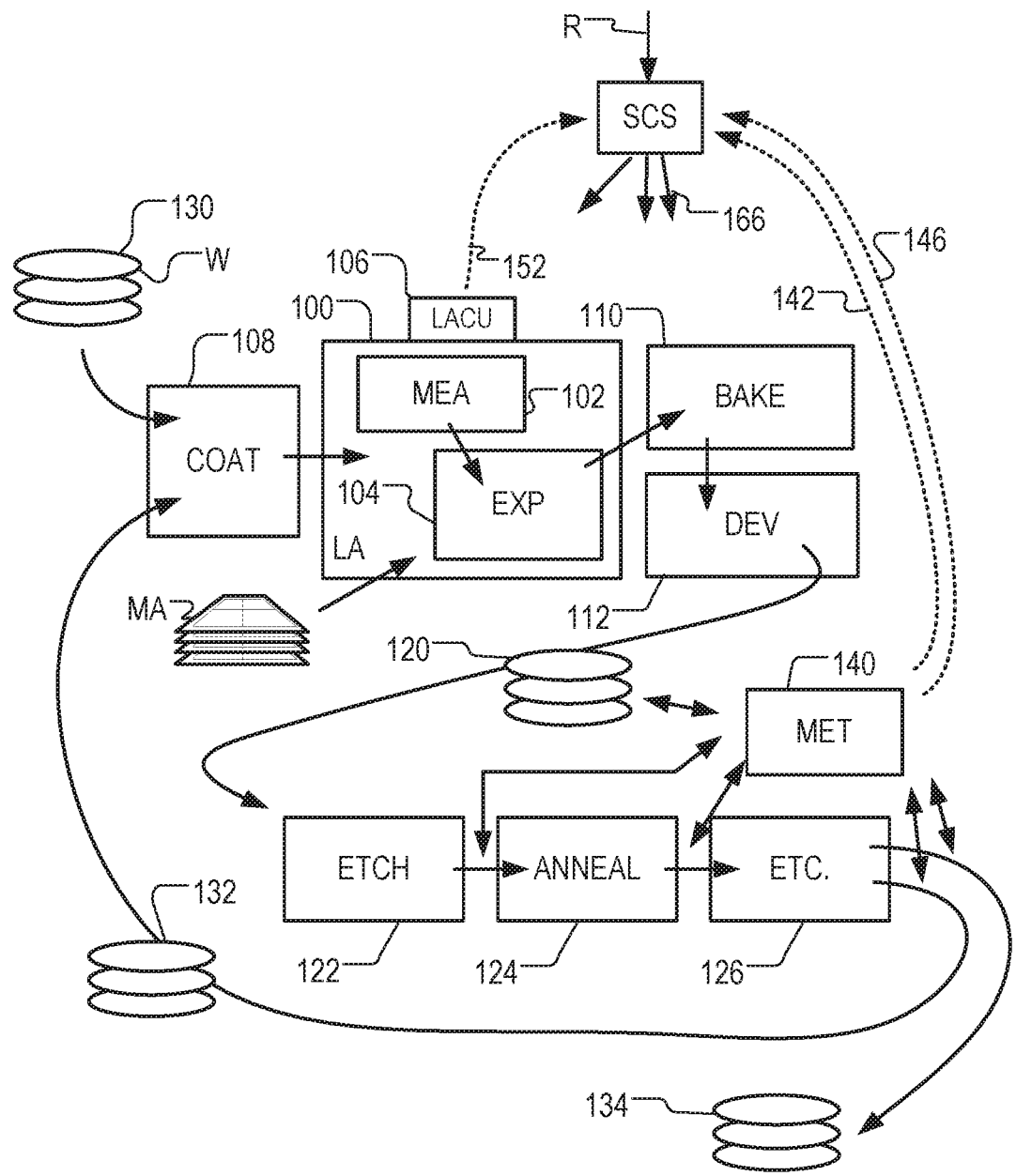
FIG. 1 illustrates a lithographic apparatus together with other apparatuses forming a production facility for semiconductor devices adaptable according to an embodiment of the invention.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" for short) 100, a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Figure 2:
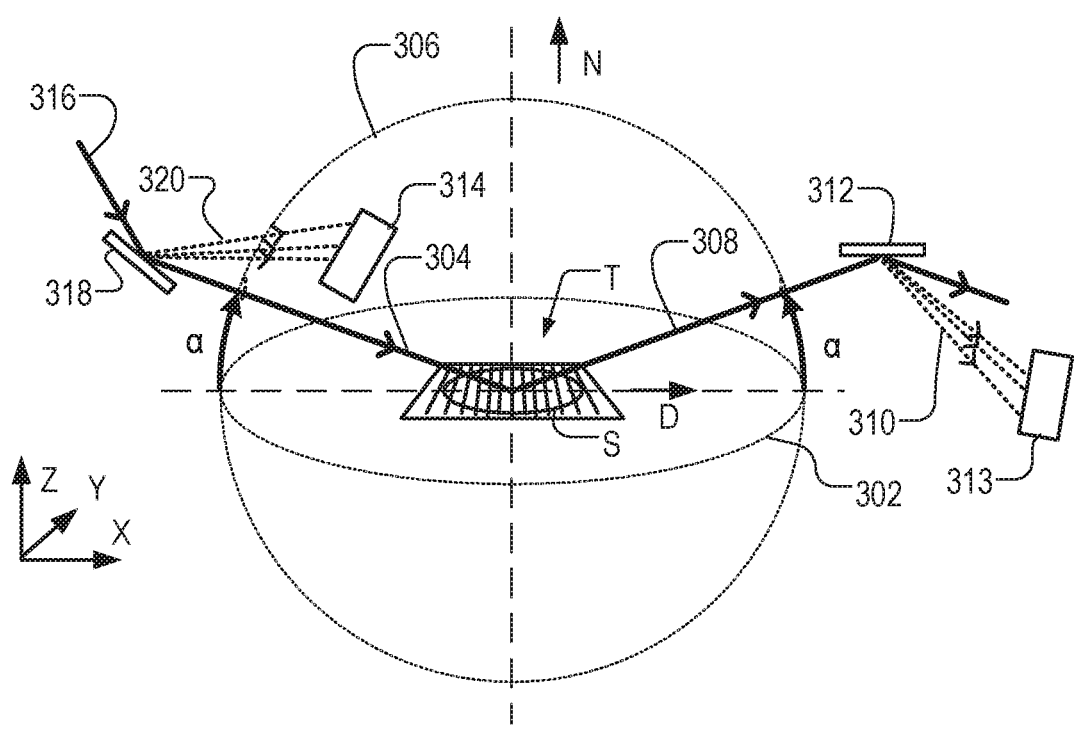
FIG. 2 illustrates the geometry of incident, reflected and diffracted beams in an EUV metrology method.

FIG. 2 illustrates an EUV metrology method while FIG. 3 illustrates an EUV metrology apparatus 300. The apparatus can be used as an example of EUV metrology apparatus 244 for measuring parameters of substrates W processed in the manufacturing system of FIG. 1.

In FIG. 2, the target T is represented schematically as comprising a one-dimensional grating structure at the origin of a spherical reference frame. Axes X, Y and Z are defined relative to the target. (Of course any arbitrary coordinate system can be defined in principle, and each component may have its own local reference frame, that can be defined relative to the one shown.) The direction of periodicity D of the target structure is aligned with the X axis. The drawing is not a true perspective drawing, but a schematic illustration only. The X-Y plane is the plane of the target and substrate, and for clarity is shown tilted toward the viewer, represented by an oblique view of circle 302. The Z direction defines the direction N normal to the substrate. In FIG. 2, one of the incident rays is labeled 304 and has an angle α of grazing incidence. In this example, the incident ray 304 (and all incident rays forming the radiation spot S) lie substantially in a plane parallel to the X-Z plane, that is a plane defined the directions D and N and represented by circle 306. A reflected ray 308 that is not scattered by the periodic structure of the target T emerges towards the right hand side of the target in the diagram, with an elevation angle α.

To perform spectroscopic reflectometry, ray 308 and other reflected rays are broken into a spectrum 310, comprising rays of different wavelengths. The spectrum may be produced for example using a grazing incidence diffraction grating 312. The diffraction grating 312 may be a diffractive optical element according to an embodiment of the present invention, for example as described with reference to FIG. 6 or 7. This enables alignment of the optical system according to an embodiment of the present invention, for example as described with reference to FIG. 5. The spectrum is detected by a detector 313. This detector, which may for example be a CCD image detector having an array of pixels, is used to transform the spectrum into electrical signals and eventually digital data for analysis.

In a practical system, the spectrum of radiation 304 may be subject to time variations, which would disturb the analysis. In order to normalize the detected spectrum against these variations, a reference spectrum is captured by a second detector 314. To produce the reference spectrum, source radiation 316 is diffracted by another diffraction grating 318. The diffraction grating 318 may be a diffractive optical element according to an embodiment of the present invention, for example as described with reference to FIG. 6 or 7. This enables alignment of the optical system according to an embodiment of the present invention, for example as described with reference to FIG. 5. A zero order reflected ray of grating 318 forms the incident ray 304, while the first order diffracted rays 320 of grating 318 form the reference spectrum detected by reference spectrum detector 314. Electrical signals and data representing the reference spectrum are obtained for use in the analysis.

From the measured spectrum, obtained for one or more values of incidence angle α, a measurement of a property of the target structure T can be calculated in a manner described further below.

Figure 3A:
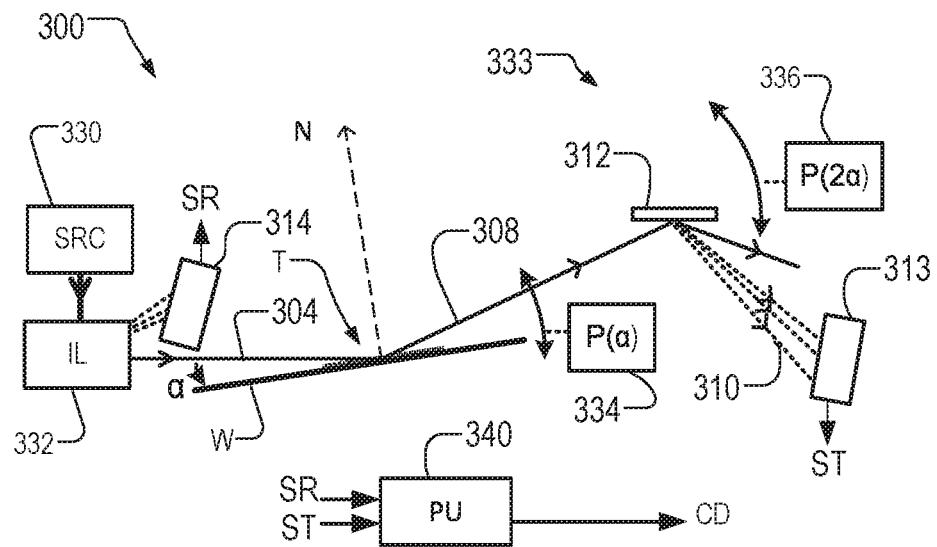
FIG. 3(a) illustrates the components of a metrology apparatus, performing the method of FIG. 2 and adaptable according to an embodiment of the invention.

Turning to FIG. 3(a), EUV metrology apparatus 300 is provided for measuring properties of a metrology target T formed on substrate W, by the method of FIG. 2. Various hardware components are represented schematically. The practical implementation of these components can be performed by the relevant skilled persons applying a mixture of existing components and specially-designed components, according to well-known design principles. A support (not shown in detail) is provided for holding the substrate at a desired position and orientation relative to other components to be described. A radiation source 330 provides radiation to an illumination system 332. Illumination system 332 provides a beam of EUV radiation represented by ray 304 which forms a focused irradiation spot on target T. Illumination system 332 also provides the reference spectrum 320 to detector 314. Components 312, 313 etc. may be conveniently considered as a detection system 333.

Substrate W in this example is mounted on a movable support having a positioning system 334 such that an angle of incidence a of ray 304 can be adjusted. In this example, it is chosen as a matter of convenience to tilt the substrate W to change the incidence angle, while the source 330 and illumination system 332 remain stationary. In order to catch the reflected ray 308, detection system 333 is provided with a further movable support 336, so that it moves through an angle 2α relative to the stationary illumination system, or through an angle α relative to the substrate. In the grazing incidence regime of reflectometry, it is convenient to define the incidence angle α by reference to the plane of the substrate, as shown. Of course, it could equally be defined as an angle between the direction of incidence of incident ray I and a direction N normal to the substrate.

Additional actuators, not shown, are provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detector stay still, or whether the substrate stays still while the illumination system and detector are moved, or whether different components of the relative movement are achieved by a combination of these techniques. The present disclosure encompasses all these variants.

As already described with reference to FIG. 2, the radiation reflected by target T and substrate W is split into a spectrum 310 of rays of different wavelengths, before it impinges on detector 313. Detector 306 comprises for example a position-sensitive EUV detector, typically an array of detector elements. The array may be a linear array, but in practice a 2-dimensional array of elements (pixels) may be provided. Detector 313 may be for example a CCD (charge coupled device) image sensor.

A processor 340 receives signals from the detectors 313 and 314. In particular, signal ST from detector 313 represents the target spectrum and signal SR from detector 314 represents the reference spectrum. Processor 340 can subtract the reference spectrum from the target spectrum to contain a reflection spectrum of the target, normalized against variation in the source spectrum. The resulting reflection spectra for one or more angles of incidence are used in the processor to calculate a measurement of property of the target, for example CD or overlay.

In practice, radiation from source 330 may be provided in a series of short pulses and signals SR and ST may be captured together for each pulse. Difference signals for each individual pulse are calculated, before being aggregated into an overall reflection spectrum for this target at this angle of incidence. In this way, instability of the source spectrum between pulses is corrected for. The pulse rate may be thousands, or even tens of thousands per second (hertz). The number of pulses aggregated to measure one reflection spectrum may be tens or hundreds, for example. Even with so many pulses, the physical measurement takes a fraction of one second.

In the application of this EUV-SR to metrology in semiconductor manufacturing, small grating targets can be used. Multiple diffraction spectra are captured using detectors 313 and 314, while setting the grazing angle of incidence a to various different values. Using the detected spectra and a mathematical model of the target structure, reconstruction calculations can be performed to arrive at measurement of CD and/or other parameters of interest. An example reconstruction method will be illustrated further below.

Considering briefly the target itself, dimensions of the lines and spaces will depend on the target design, but the period of the structure may be for example less than 100 nm, less than 50 nm, less than 20 nm, even less than 10 nm and down to 5 nm. The lines of the grating structure may be of the same dimension and pitch as product features in a product area of the substrate. The lines of the grating structure may in fact be the lines of a product structure, rather than a target structure formed, within a dedicated target area, solely for the purposes of metrology. Such small features may be formed for example in an EUV lithography process, by imprint lithography or by direct-write methods. Such small features may also be formed using present-day DUV lithography, by a so-called double-patterning processes (generally multiple-patterning). Techniques in this category include pitch-doubling, for example by litho-etch-litho-etch (LELE) and self-aligned dual-damascene in back end-of the line (BEOL) layers. For the purposes of explanation, it will be assumed in the following examples that CD is the parameter of interest. However, where there are two gratings formed on top of one another, another parameter of interest maybe overlay. This can be measured based on asymmetry in the EUV-SR diffraction orders, as described separately below. The incidence angle can be elevated if necessary to achieve adequate penetration to the lower structure.

In the multiple-patterning process, structures are formed in one layer of the product not in one patterning operation but in two or more patterning steps. Thus, for example, a first population of structures may be interleaved with a second population of structures, and the populations are formed in different steps, so as to achieve a higher resolution than one step alone can produce. While the placement of the populations should be identical and perfect in relation to other features on the substrate, of course every real pattern exhibits a certain positional offset. Any unintentional positional offset between the populations can be regarded as a form of overlay, and can be measured by analogous techniques to those used to measure overlay between layers. Additionally, overlay against features in an underlying or overlying layer can be different for each population when multiple populations of features are formed in a single layer, and overlay for each of these populations can be measured separately if desired.

Figure 3B:
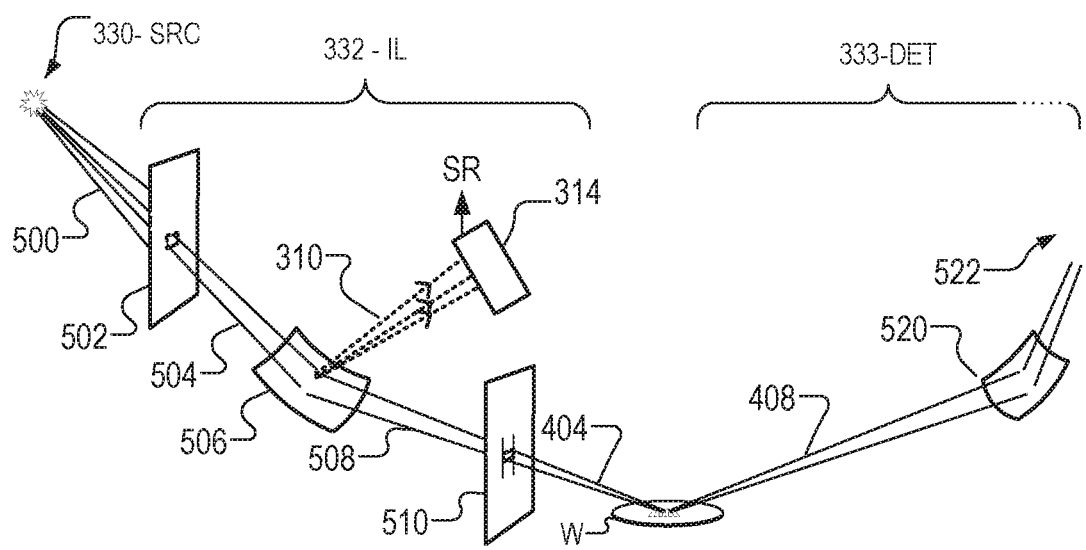
FIG. 3(b) illustrates the components of an illumination system of the apparatus of FIG. 3(a)

FIG. 3(b) illustrates one possible arrangement of the illumination system 332 in the apparatus of FIG. 3(a). A radiation source such as a plasma is represented at 330. For EUV lithography several types of sources have been tested and built experimentally or commercially. Any of these can be applied in the present apparatus, according to the range of wavelengths desired. Plasma sources include tin (Sn) but also Xe or Ar or Kr or Ne or N, or any combination of them. Laser driven light sources and harmonic generator sources can be applied. Plasma sources are not the only types of sources that can be applied, although at present they are the type that is most available in compact form. Synchrotron sources may yield more useful power levels, and be more controllable in wavelength and power, but these are not yet commercially available in a compact form.

A beam 500 of EUV radiation having desired spectral characteristics is emitted in a range of directions. At the exit of the source 330 (the entrance to the illumination system 332), a first aperture 502 is provided to serve as an entrance pupil for the illumination system. An incoming beam 504 with well-defined divergence impinges on a focusing optical element or system. This focusing system is implemented in the present illustration by a 2-dimensionally curved mirror 506, for example an ellipsoidal mirror. Mirror 506 produces a convergent beam 508, which is focused to form the spot at the target location on substrate W. Optionally, a second aperture 510 is provided to restrict the diameter of beam 404 at the target. In particular, aperture 510 may be made adjustable in height and/or width so that different shapes of beam B' can be generated according to different desires/ sizes, and different incidence angles α.

Reflected beam 408 enters detection system 333 (not shown in this view), carrying information about the structure of the target. Optionally, a second focusing mirror 520 is provided to reduce divergence of the beam, as it enters detection system 333.

As seen in FIGS. 2 and 3(a), a reference spectrum 320 is formed and detected by reference spectrum detector 314. In the example illumination system illustrated in FIG. 3(b), the grating 318 for generating reference spectrum 320 is integrated in the curved mirror 506. In alternative embodiments, the reference spectrum grating 318 could be provided as a separate element in series with the mirror 506. In either case, the mirror and diffraction grating 506/318 or separate element 318 may be a diffractive optical element according to an embodiment of the present invention, for example as described with reference to FIG. 6 or 7. This enables alignment of the optical system according to an embodiment of the present invention, for example as described with reference to FIG. 5. Further, in order to focus radiation from beam 504 into beam 508, the single two-dimensionally curved mirror 506 could be replaced by a series of two or more one-dimensionally curved (cylindrical) mirrors. The grating, wherever it is provided, may be of the "flat field" type, so that a well-resolved spectrum is formed across a linear or planar pixel array in detector 314. Similarly, where a two-dimensionally curved focusing mirror 520 is provided at a detection side, one or more dimensionally curved mirrors may be provided. The curved mirror can be integrated with the grating 312 which forms the spectrum 310 of the radiation reflected by the target. The mirror and diffraction grating 312 may be a diffractive optical element according to an embodiment of the present invention, for example as described with reference to FIG. 6 or 7. This enables alignment of the optical system according to an embodiment of the present invention, for example as described with reference to FIG. 5. Note that it may not be necessary to focus the beam 408 in two dimensions in order to obtain a desired spectral resolution.

Metrology tools may be developed which use sources that emit radiation in "soft X-ray" or EUV range, for example having wavelengths between 2 nm and 50 nm. Examples of such sources include Discharge Produced Plasma sources, Laser Produced Plasma Sources or High-order Harmonic Generation (HHG, or High Harmonic Generation) sources. HHG sources are known to be able to provide large flux of collimated photons (high luminance) in the emitted light.

HHG sources used in metrology applications are illustrated and further described in the European patent applications EP152020301, EP16168237, EP16167512, which are hereby incorporated in their entirety by reference. In metrology applications, such HHG sources may be used (for example) in normal incidence, very close to normal incidence (e.g., within 10 degrees from normal), at a grazing incidence (e.g., within 20 degrees from surface), at an arbitrary angle or at multiple angles (to obtain more measurement information in a single capture).

Figure 4:
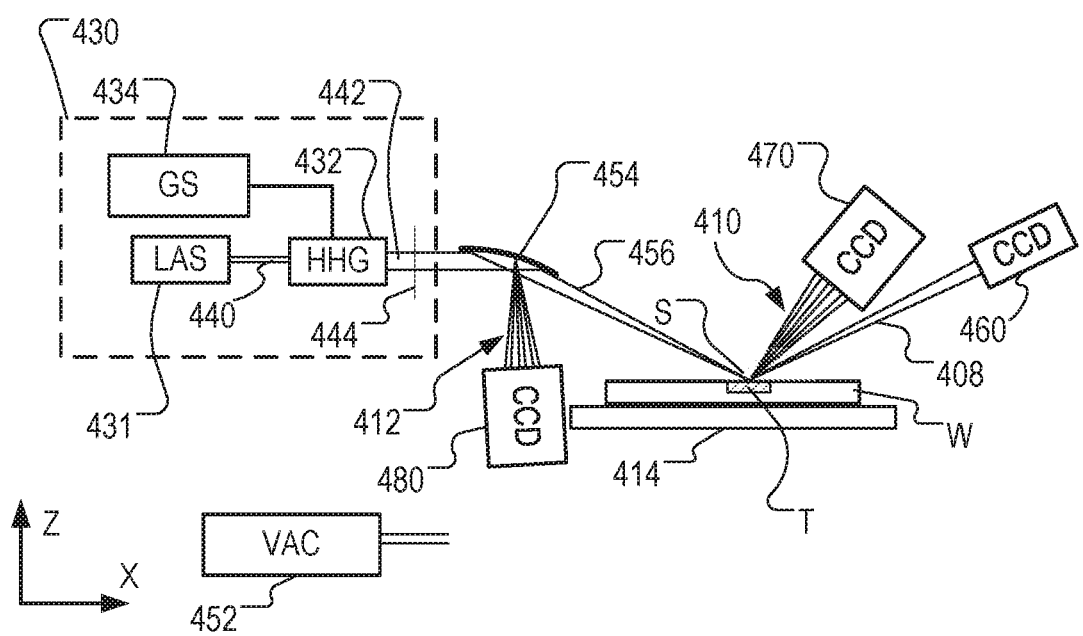
FIG. 4 illustrates a metrology apparatus using a HHG source adaptable according to an embodiment of the invention.

FIG. 4 illustrates a metrology arrangement including a radiation source 430 in detail. Radiation source 430 is an HHG source for generating EUV radiation based on high harmonic generation (HHG) techniques. The main components of the radiation source 430 are a pump laser 431 and an HHG medium, such as a HHG gas cell 432 (a HHG solid surface medium may also be used). A gas supply 434 supplies suitable gas to the gas cell, where it is optionally ionized by an electric source (not shown). The pump laser 431 may be for example a fiber-based laser with an optical amplifier, producing pulses of infrared radiation lasting less than 1 ns (1 nanosecond) per pulse, with a pulse repetition rate up to several megahertz, as required. The wavelength may be for example in the region of 1 μm (1 micron). The laser pulses are delivered as a pump radiation beam 440 to the HHG gas cell 432, where a portion of the radiation is converted to higher frequencies. From the HHG gas cell 432 emerges a beam of measurement radiation 442 including coherent radiation of the desired wavelength or wavelengths.

The measurement radiation 442 may contain multiple wavelengths. If the radiation is monochromatic, then measurement calculations (reconstruction) may be simplified, but it is easier with HHG to produce radiation with several wavelengths. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials.

One or more filtering devices 444 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell 432. The grating may be a diffractive optical element according to an embodiment of the present invention, for example as described with reference to FIG. 6 or 7. This enables alignment of the optical system according to an embodiment of the present invention, for example as described with reference to FIG. 5.

Some or all of the beam path may be contained within a vacuum environment, bearing in mind that EUV radiation is absorbed when traveling in air. The various components of radiation source 430 and illumination optics can be adjustable to implement different metrology 'recipes' within the same apparatus. For example different wavelengths and/or polarization can be made selectable.

From the radiation source 430, the filtered beam enters an inspection chamber where the substrate W including a structure of interest or target structure is held for inspection by substrate support 414. The target structure is labeled T. In operation, the atmosphere within inspection chamber is maintained near vacuum by vacuum pump 452, so that the soft X-ray radiation can pass without undue attenuation through the atmosphere. The illumination system includes one or more optical elements 454 for focusing the radiation into a focused beam 456, and may comprise for example a two-dimensionally curved mirror, or a series of one-dimensionally curved mirrors, as described in the prior patent applications mentioned above. The spectrum 410 is formed by interaction of the beam 456 with the target T. The beam 456 is thus diffracted 410 towards the CCD detector 470. In the example optical system illustrated in FIG. 4, the target T on the wafer W has a periodic structure. The target T may be a diffractive optical element according to an embodiment of the present invention, for example as described with reference to FIG. 6 or 7. This enables alignment of the optical system according to an embodiment of the present invention, for example as described with reference to FIG. 5. The focusing is performed to achieve a round or elliptical spot under 10 μm in diameter, when projected onto the structure of interest. Substrate support 414 comprises for example an X-Y translation stage and a rotation stage, by which any part of the substrate W can be brought to the focal point of beam to in a desired orientation. Thus the radiation spot S is formed on the structure of interest. The radiation reflected 408 from the structure of interest is then detected by detector 460.

The reference spectrum 412 is formed by interaction of the beam 442 with the curved mirror 454. The beam 442 is thus diffracted 412 towards the CCD detector 480. In the optical system illustrated in FIG. 4, the grating for generating reference spectrum 412 is integrated in the curved mirror 454. In alternative embodiments, the reference spectrum grating could be provided as a separate element in series with the mirror 454 along the optical path. In either case, the mirror and diffraction grating 454 or separate element may be a diffractive optical element according to an embodiment of the present invention, for example as described with reference to FIG. 6 or 7. This enables alignment of the optical system according to an embodiment of the present invention, for example as described with reference to FIG. 5.

As discussed above, it is necessary to align the optical elements during the assembly phase and during maintenance. According to an embodiment of the present invention, it is possible to use the IR drive laser 431 itself rather than the SXR light generated by HHG to align an optical system including diffractive optical elements. The IR laser can be colinear with the SXR light, but is much easier to work with because it allows the use of much simpler tools (e.g. view cards coated with an IR photosensitive material) and does not require vacuum. The present invention is simple to implement and reduces alignment complexity.

Embodiments of the present invention may use multi-pitch gratings that are optimized such that they have the same diffraction angles for IR as for SXR. This can be done with only minor impact on the SXR performance.

Diffraction from a grating is typically described by the grating equation, $$\sin\theta i - \sin\theta f = n\lambda/p$$

where $\theta i$ and $\theta f$ are the angles of the incoming and diffracted beam, n is the diffraction order, $\lambda$ the wavelength, and p the pitch of the structure. This formula is only valid in the planar configuration (i.e. incident light is perpendicular to the grating lines), but similar formulas are available to describe arbitrary configurations.

In all cases, the diffractions angle only depend on the factor $n\lambda/p$. Hence, if $\lambda$ and p are scaled simultaneously, the diffraction angle will remain the same.

Gratings with multiple pitches may be used, such that $nIR\lambda IR/pIR = nSXR\lambda SXR/pSXR$.

The SXR light will also diffract from the large pitch pIR, but the diffraction angle will be very small, hence the light can be easily ignored. Various multi-pitch gratings are described with reference to FIG. 6 below.

Figure 5:
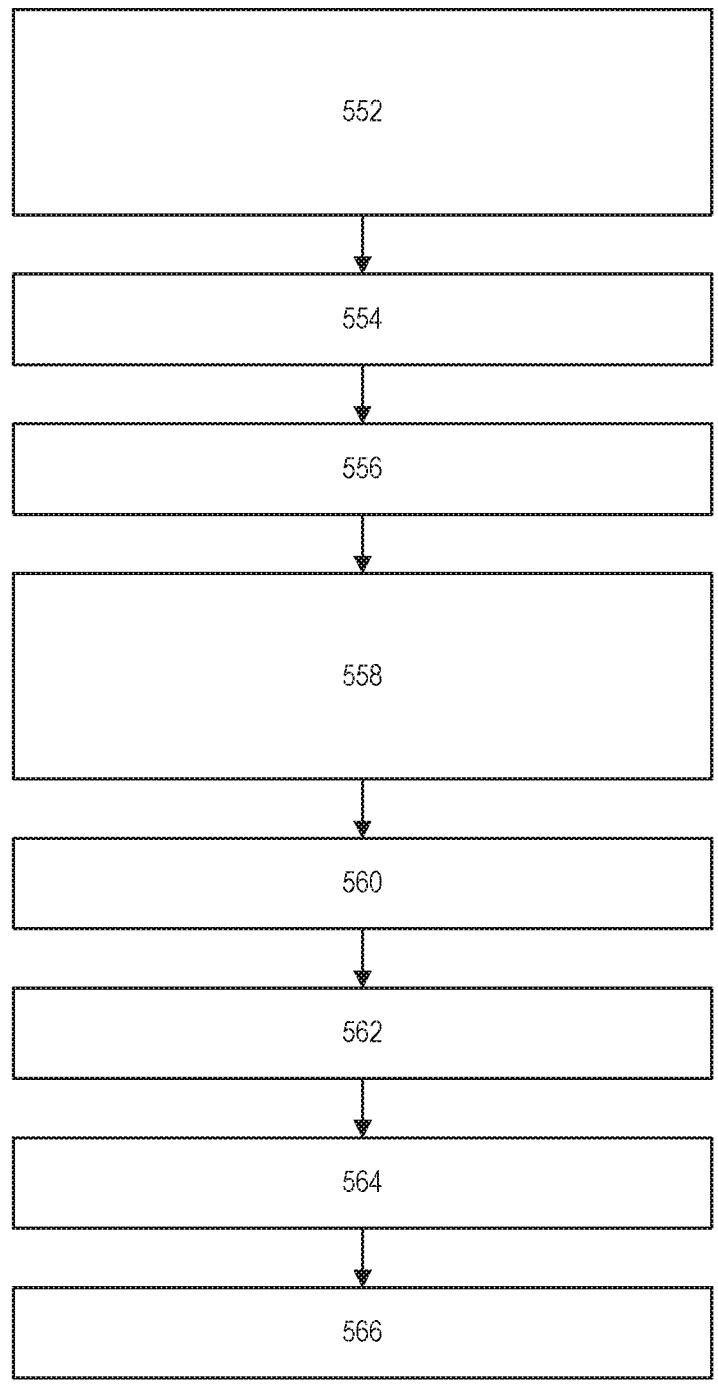
FIG. 5 is a flowchart of a method of aligning a diffractive optical system in accordance with an embodiment of the present invention.

FIG. 5 is a flowchart of a method of aligning a diffractive optical system to be operated with an operating beam. An alignment beam is used having a different wavelength range from the operating beam. The wavelength range of the alignment beam is typically at longer wavelengths than that of the operating beam. In this example, the alignment beam comprises infra-red (IR) radiation and the operating beam comprises soft X-ray (SXR) radiation. The SXR operating beam is to be generated by a high harmonic generation (HHG) optical source (e.g. 432 of FIG. 4) pumped by the IR alignment beam (e.g. 440 of FIG. 4). The method has the following steps:

552: Install a diffractive optical element in the optical system. The diffractive optical element is optimized by providing it with a first periodic structure with a first pitch (pIR) and a second periodic structure with a second pitch (pSXR). The diffractive optical element may be, for example, as described with reference to FIG. 6 or 7.

554: Remove the IR filter (e.g. 444 of FIG. 4), if it is already installed. The IR (pump radiation/alignment beam) filter is used during operation when using the SXR operating beam. Removing the alignment beam filter from the high harmonic generation optical source while performing the aligning allows the alignment beam to pass through the optical system. In this way the alignment beam can be used for alignment of the optical elements making up the optical system.

556: Set the IR pump laser (e.g. 431 of FIG. 4), which has already been installed, to a low power. Thus the aligning is performed using an alignment beam having a lower intensity than used for generating the operating beam.

558: Align the diffractive optical system using the alignment beam (IR) and using the diffractive optical element optimized to diffract the alignment beam and the operating beam in predetermined directions. The alignment beam is directed during the aligning along the same optical path as the operating beam is to be directed along towards the diffractive optical element during operation of the diffractive optical system. This is convenient because the IR will follow the same reflected optical paths as the SXR radiation will follow in operation. Aligning the diffractive optical system comprises configuring optical elements of the diffractive optical system. The optical elements may comprise one or more diffractive optical elements, optical detectors and optical sources. The configuring can comprise arranging position, orientation or optical characteristics of the optical elements.

The predetermined directions may be the same direction. This is convenient because the IR will follow the same diffracted optical paths as well as the reflected optical paths as the SXR radiation will follow in operation. The optical system can then be aligned using an SXR sensor which is also sensitive to IR. The SXR optical path can be predicted and traced using IR during alignment. This is convenient as it can be done at atmospheric pressure by a technician with access to the optical path. Low power IR is also safe to use for the alignment procedure, for example by using view cards to manually intersect and highlight the diffracted optical path.

Once alignment of the optical system is successful, the optical elements may be permanently fixed in place. This advantageously adds stability to the optical system and makes it more reliable. Also, performing the positioning of the optical elements only once, during assembly, reduces the cost of goods (CoG).

560: Replace the IR filter and complete assembly of the optical system.

562: To begin operation of the optical system, pump down the vacuum system.

564: Increase IR laser power and generate SXR radiation by HHG.

566: Optionally, the alignment of the optical system can be checked using the SXR radiation. The aligned optical system can then be operated using SXR for metrology measurements.

Figure 6:
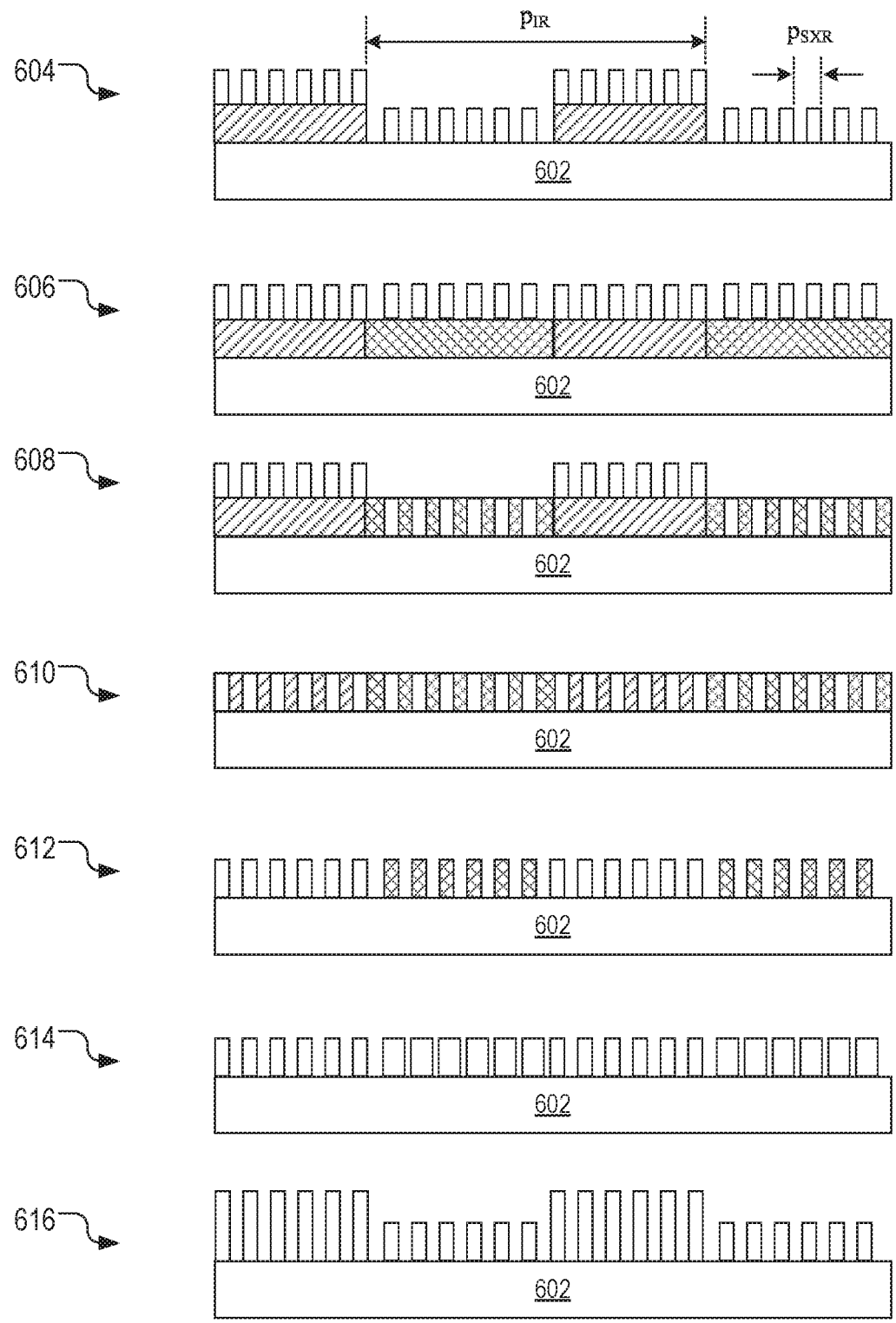
FIG. 6 illustrates multi-pitch gratings for use as diffractive optical elements in accordance with an embodiment of the present invention.

FIG. 6 illustrates cross-sections of portions of multi-pitch gratings for use as diffractive optical elements in accordance with an embodiment of the present invention. Multi-pitch gratings 604 to 616 are each fabricated on a substrate 602.

The two pitches pIR and pSXR are labelled on the first grating 604. Although two pitches are used in the multi-pitch gratings illustrated here, three or more pitches may be used. Thus more than one operating wavelength and/or more than one alignment wavelength may be used.

The substrate 602 may be made of, for example, silicon (Si) or glass. The pattern and fill layers of the multi-pitch gratings 604 to 616 may be made of, for example, Si (crystalline or amorphous), SiO2, Si3N4 or photoresist, or combinations of such materials. The different materials are depicted as having different hatching; either none, left-diagonal, right-diagonal or cross-hatching. Multi-pitch grating 606 has one grating overlaid on another. Multi-pitch gratings 610 to 616 are coplanar. Rather than using different materials, multi-pitch gratings 614 and 616 have different linewidth and line height of a fine pitch (pSXR) grating respectively in order to define the course pitch (pIR) grating.

Figure 7A:
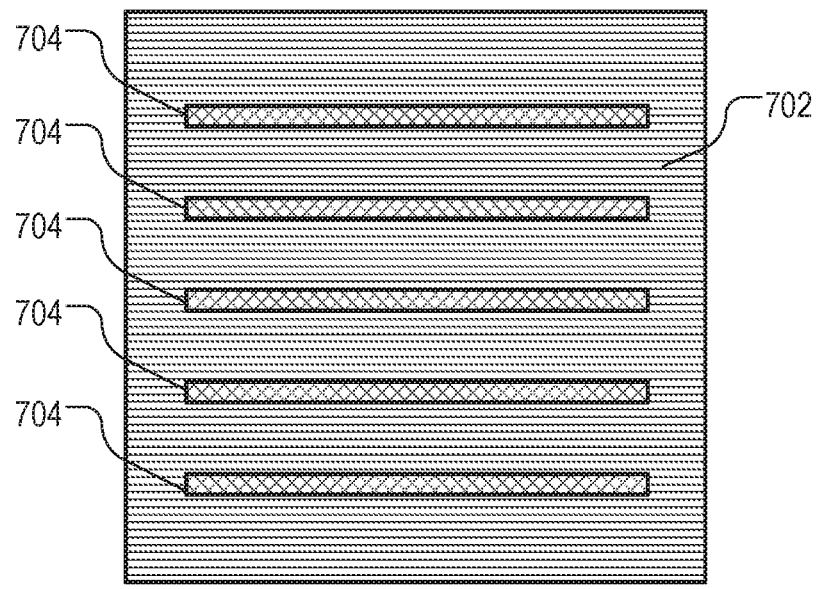
FIGS. 7(a)-7(b) illustrate diffractive optical elements in accordance with embodiments of the present invention.
Figure 7B:
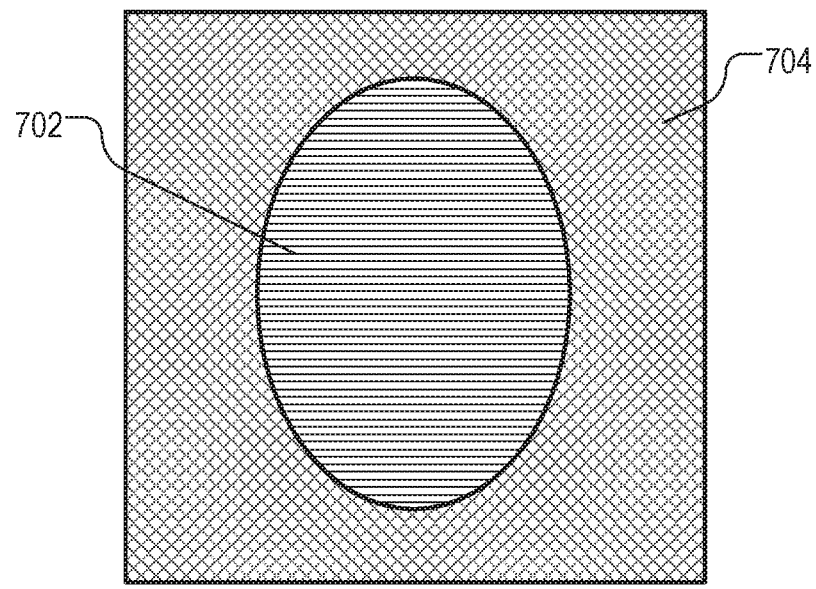

FIG. 7 illustrates plan views of diffractive optical elements in accordance with embodiments of the present invention. With reference to FIG. 7(*a*), a fine pitch (pSXR) grating 702 is interleaved and coplanar with a course pitch (pIR) grating 704.

With reference to FIG. 7(*b*), a fine pitch (pSXR) grating 702 is formed at a region corresponding to the SXR operating beam's spot when projected on the diffractive optical element. In this example, the region is an ellipse. The course pitch (pIR) grating 704 is formed at a region corresponding to the IR alignment beam's spot when projected on the diffractive optical element. In this case the IR spot is larger, so the region extends around the smaller SXR operating beam's spot.

The diffractive optical elements described with reference to FIGS. 6 and 7 may be incorporated in a lithographic apparatus as described with reference to FIG. 1 and/or a metrology apparatus such as described with reference to FIGS. 2 to 4. As another example, diffractive optical elements described with reference to FIGS. 6 and 7 may be incorporated in a monochromator or other diffractive optical system. In such diffractive optical systems, methods according to the present invention may be used to align optical elements.

Further embodiments are disclosed in the subsequent numbered clauses:

1. A method of aligning a diffractive optical system to be operated with an operating beam, the method comprising:
    aligning the diffractive optical system using an alignment beam having a different wavelength range from the operating beam and using a diffractive optical element optimized to diffract the alignment beam and the operating beam in predetermined directions.

2. The method of clause 1, wherein the predetermined directions are the same direction.

3. The method of clause 1 or clause 2, wherein the alignment beam is directed during the aligning along the same optical path as the operating beam is to be directed along towards the diffractive optical element during operation of the diffractive optical system.

4. The method of any preceding clause, wherein the wavelength range of the alignment beam is at longer wavelengths than that of the operating beam.

5. The method of clause 4, wherein the alignment beam comprises infra-red radiation and the operating beam comprises soft X-ray radiation.

6. The method of any preceding clause, wherein the operating beam is to be generated by a high harmonic generation optical source pumped by the alignment beam's optical source.

7. The method of clause 6, wherein the aligning is performed using an alignment beam having a lower intensity than used for generating the operating beam.

8. The method of clause 7, further comprising removing an alignment beam filter from the high harmonic generation optical source while performing the aligning, the alignment beam filter to be used during operation with the operating beam.

9. The method of any preceding clause wherein aligning the diffractive optical system comprises configuring optical elements of the diffractive optical system.

10. The method of any preceding clause further comprising optimizing the diffractive optical element by providing the diffractive optical element with a first periodic structure with a first pitch and a second periodic structure with a second pitch.

11. The method of clause 10, wherein the periodic structures comprise a multi-pitch periodic structure.

12. The method of clause 8, wherein the periodic structures comprise a grating.

13. The method of any of clauses 10 to 12, wherein the periodic structures are coplanar.

14. The method of any of clauses 10 to 13, wherein the periodic structures are overlaid.

15. The method of any of clauses 10 to 13, wherein the periodic structures are interleaved.

16. The method of any of clauses 10 to 13, wherein:
    the first periodic structure is formed at a region corresponding to the alignment beam's spot when projected on the diffractive optical element; and
    the second periodic structure is formed at a region corresponding to the operating beam's spot when projected on the diffractive optical element.

17. A method of diffracting first and second beams having different wavelength ranges in a same direction, the method comprising:
    using a diffractive optical element having a first periodic structure with a first pitch and a second periodic structure with a second pitch, wherein the pitches are selected to diffract the first and second beams in the same direction.

18. The method of clause 17, wherein the first beam is directed along the same optical path as the second beam is directed along towards the diffractive optical element.

19. The method of clause 17 or clause 18, wherein the wavelength range of the first beam is at longer wavelengths than that of the second beam.

20. The method of clause 19, wherein the first beam comprises infra-red radiation and the second beam comprises soft X-ray radiation.

21. The method of any of clauses 17 to 20, wherein the periodic structures comprise a multi-pitch periodic structure.

22. The method of any of clauses 17 to 21, wherein the periodic structures comprise a grating.

23. The method of any of clauses 17 to 22, wherein the periodic structures are coplanar.

24. The method of any of clauses 17 to 23, wherein the periodic structures are overlaid.

25. The method of any of clauses 17 to 23, wherein the periodic structures are interleaved.

26. The method of any of clauses 10 to 23, wherein:
    the first periodic structure is formed at a region corresponding to the first beam's spot when projected on the diffractive optical element; and
    the second periodic structure is formed at a region corresponding to the second beam's spot when projected on the diffractive optical element.

27. A method of aligning a diffractive optical system to be operated with an operating beam, the method comprising diffracting first and second beams having different wavelength ranges in a same direction in accordance with any of clauses 17 to 26, wherein the first beam is an alignment beam and the second beam is the operating beam.

28. A diffractive optical element for diffracting first and second beams having different wavelength ranges in a same direction, the diffractive optical element comprising: a first periodic structure with a first pitch and a second periodic structure with a second pitch, wherein the pitches are selected to diffract the first and second beams in the same direction.

29. The diffractive optical element of clause 28, wherein the pitches are selected to diffract the first and second beams in the same direction when the first beam is directed along the same optical path as the second beam is directed along towards the diffractive optical element.

30. A diffractive optical element for diffracting first and second beams having different wavelength ranges in predetermined directions, the diffractive optical element comprising:
  a first periodic structure with a first pitch and a second periodic structure with a second pitch, wherein the pitches are selected to diffract the first and second beams in the predetermined directions wherein:
  the first periodic structure is formed at a region corresponding to the first beam's spot when projected on the diffractive optical element; and
  the second periodic structure is formed at a region corresponding to the second beam's spot when projected on the diffractive optical element.

31. The diffractive optical element of clause 30, wherein the predetermined directions are the same direction.

32. The diffractive optical element of clause 30 or clause 31, wherein the pitches are selected to diffract the first and second beams in the same direction when the first beam is directed along the same optical path as the second beam is directed along towards the diffractive optical element.

33. A metrology apparatus comprising the diffractive optical element of any of clauses 28 to 32.

34. A lithographic apparatus comprising the diffractive optical element of any of clauses 28 to 32.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the optical systems encompass all types of electromagnetic radiation, including infra red radiation (e.g., having a wavelength in the range 700 nm to 10 µm), visible radiation (e.g., having a wavelength in the range 400 to 700 nm), ultraviolet (UV) radiation (e.g., having a wavelength in the range 200 to 400 nm or about 365, 355, 248, 193, 157 or 126 nm), deep ultraviolet (DUV) radiation (e.g., having a wavelength in the range 50 to 200 nm, and soft X-Ray (SXR) or extreme ultra-violet (EUV) radiation (e.g., having a wavelength in the range of 2 to 50 nm). Combinations may include one wavelength from SXR or DUV for the operating beam, and one wavelength from visible or IR for the alignment beam. A typical HHG example would use a 35 nm wavelength for the operating beam and an 800 nm wavelength for the alignment beam.

The term "optical element", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of aligning a diffractive optical system, the method comprising:
  outputting an operating beam of radiation;
  outputting an alignment beam of radiation; and
  aligning the diffractive optical system using the alignment beam, wherein a wavelength range of the alignment beam is different than a wavelength range of the operating beam;
  wherein the aligning comprises using a diffractive optical element to diffract the alignment beam and the operating beam in predetermined directions; and
  wherein the alignment beam is directed during the aligning along a same optical path as the operating beam is to be directed along towards the diffractive optical element during operation of the diffractive optical system.

2. The method of claim 1, wherein the predetermined directions are the same direction.

3. The method of claim 1, wherein the wavelength range of the alignment beam is at longer wavelengths than the wavelength range of the operating beam, and wherein the alignment beam comprises infra-red radiation and the operating beam comprises soft X-ray radiation.

4. The method of claim 1, further comprising generating the operating beam using a high harmonic generation optical source pumped by an optical source of the alignment beam.

5. The method of claim 4, wherein the outputting the aligning beam is performed using an alignment beam having a lower intensity than used for generating the operating beam; and
wherein the method further comprises removing an alignment beam filter from a high harmonic generation optical source while performing the aligning, the alignment beam filter to be used during operation with the operating beam.

6. The method of claim 5, wherein the providing the periodic structures comprises providing a grating.

7. The method of claim 1, wherein the aligning the diffractive optical system comprises configuring optical elements of the diffractive optical system.

8. The method of claim 1, further comprising providing the diffractive optical element with a first periodic structure with a first pitch and a second periodic structure with a second pitch so as to optimize the diffractive optical element.

9. The method of claim 8, wherein the providing the first and second periodic structures comprises providing a multi-pitch periodic structure.

10. The method of claim 8, further comprising orienting the periodic structures as coplanar.

11. The method of claim 8, further comprising overlaying the periodic structures.

12. The method of claim 8, further comprising interleaving the periodic structures.

13. The method of claim 8, wherein:
the first periodic structure is formed at a region corresponding to the alignment beam's spot when projected on the diffractive optical element; and
the second periodic structure is formed at a region corresponding to the operating beam's spot when projected on the diffractive optical element.

14. A method comprising:
outputting a first beam having a wavelength range;
outputting a second beam in a same direction as the first beam, wherein the second beam has a different wavelength range than the wavelength range of the first beam;
directing the first and second beams along a same optical path; and
diffracting the first and the second beams using a diffractive optical element having a first periodic structure with a first pitch and a second periodic structure with a second pitch, wherein the pitches are selected to diffract the first and second beams in the same direction.

15. A diffractive optical system comprising:
a diffractive optical element configured to diffract an alignment and an operating beam in predetermined directions, the diffractive optical element comprising:
a first periodic structure with a first pitch; and
a second periodic structure with a second pitch, wherein the first and second pitches are selected to diffract the alignment and operating beams in the predetermined directions,
wherein the first periodic structure is formed at a first region corresponding to the alignment beam's spot when projected on the diffractive optical element; and
wherein the second periodic structure is formed at a second region corresponding to the operating beam's spot when projected on the diffractive optical element; and
wherein the alignment beam is directed during an alignment operation along a same optical path as the operating beam is to be directed along towards the diffractive optical element during operation of the diffractive optical system.

16. The system of claim 15, further comprising generating the operating beam using a high harmonic generation optical source pumped by an optical source of the alignment beam.

17. The system of claim 16, wherein:
the outputting the aligning beam is performed using an alignment beam having a lower intensity than that used for generating the operating beam;
the method further comprises removing an alignment beam filter from the high harmonic generation optical source while performing the aligning; and
the alignment beam filter to be used during operation with the operating beam.

18. The system of claim 15, wherein the periodic structures comprise a grating.

19. The system of claim 15, wherein the periodic structures are at least one of coplanar and interleaved.

20. The system of claim 15, wherein the alignment beam comprises infra-red radiation and the operating beam comprises soft X ray radiation.

* * * * *

UNITED STATES PATENT AND TRADEMARK OFFICE
CERTIFICATE OF CORRECTION

Page 1 of 1

PATENT NO.       : 10,983,361 B2
APPLICATION NO.  : 15/898394
DATED            : April 20, 2021
INVENTOR(S)      : Roobol et al.

It is certified that error appears in the above-identified patent and that said Letters Patent is hereby corrected as shown below:

On the Title Page

Item (73), replace "ASML Netherlands B.V" with --ASML Netherlands B.V.--.

In the Claims

In Column 20, Line 49, replace "X ray radiation" with --X-ray radiation--.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*